US00RE51118E

(19) United States
(12) Reissued Patent
Wala

(10) Patent Number: US RE51,118 E
(45) Date of Reissued Patent: Nov. 10, 2026

(54) EFFICIENT IMPLEMENTATION OF FIXED-RATE FARROW-BASED RESAMPLING FILTER

(71) Applicant: Outdoor Wireless Networks LLC, Claremont, NC (US)

(72) Inventor: Philip M. Wala, Savage, MN (US)

(73) Assignee: Outdoor Wireless Networks LLC, Richardson, TX (US)

(21) Appl. No.: 17/980,211

(22) Filed: Nov. 3, 2022

Related U.S. Patent Documents

Reissue of:
(64) Patent No.: 10,826,676
Issued: Nov. 3, 2020
Appl. No.: 16/554,165
Filed: Aug. 28, 2019

U.S. Applications:
(60) Provisional application No. 62/725,792, filed on Aug. 31, 2018.

(51) Int. Cl.
*H04L 7/00* (2006.01)
*G06F 12/1009* (2016.01)
(Continued)

(52) U.S. Cl.
CPC ..... *H04L 7/0029* (2013.01); *G06F 12/1009* (2013.01); *G06F 12/12* (2013.01);
(Continued)

(58) Field of Classification Search
None
See application file for complete search history.

(56) References Cited

U.S. PATENT DOCUMENTS 5,581,585 A * 12/1996 Takatori ..... H04L 7/0062 375/232
5,838,739 A * 11/1998 Ramesh ..... H04L 25/0212 375/348

(Continued)

FOREIGN PATENT DOCUMENTS

WO 2012012963 A1 2/2012

OTHER PUBLICATIONS

European Patent Office, "Extended European Search Report" from EP Application No. 19855750.6, Sep. 2, 2022, from Foreign Counterpart to U.S. Appl. No. 16/554,165, pp. 1 through 16, Published: EP.

(Continued)

*Primary Examiner* — John M Hotaling, II
(74) *Attorney, Agent, or Firm* — Fogg & Powers LLC

(57) ABSTRACT

Systems and method for resampling are provided. A method of resampling includes receiving a first sampled signal that is sampled at a first sample rate, where the first sample rate is a submultiple of a system clock rate for a Farrow filter. The method further includes resampling the first sampled signal, using the Farrow filter having a plurality of finite impulse response (FIR) filters and an arbitrary position interpolator, at a second sample rate to generate a second sampled signal. The interpolation factor for each sample of the second sampled signal is retrieved from at least one lookup table stored in memory and the first sample rate and the second sample rate are fixed and locked to a common frequency reference. The method further includes outputting the second sampled signal at the second sample rate.

30 Claims, 4 Drawing Sheets

(51) Int. Cl.

| | |
|---|---|
| ***G06F 12/12*** | (2016.01) |
| ***H03H 17/02*** | (2006.01) |
| ***H04W 56/00*** | (2009.01) |
| ***H04W 88/08*** | (2009.01) |

(52) U.S. Cl.
CPC ..... *H04W 56/001* (2013.01); *G06F 2212/654* (2013.01); *H03H 17/02* (2013.01); *H04W 88/085* (2013.01)

(56) References Cited

U.S. PATENT DOCUMENTS 6,275,548 B1 * 8/2001 Wolf ..... H04L 7/0278 375/376
6,295,325 B1 * 9/2001 Farrow ..... H04L 7/0278 375/327
6,310,896 B1 * 10/2001 Langberg ..... H04L 27/2675 370/503
6,452,948 B1 * 9/2002 McCallister ..... H04B 7/2681 370/324
6,512,468 B1 * 1/2003 Zhong ..... H03H 17/0607 341/61
6,563,862 B1 * 5/2003 Knutson ..... H04L 25/05 375/295
6,772,022 B1 8/2004 Farrow et al.
7,061,409 B1 6/2006 Jäntti et al.
7,098,821 B2 * 8/2006 Husted ..... H04L 7/0029 341/61
7,340,024 B1 * 3/2008 Nelson ..... H03H 17/028 375/293
7,958,178 B2 6/2011 Barford
8,289,195 B1 * 10/2012 Dong ..... H03H 17/0292 702/66
8,786,472 B1 * 7/2014 Prince ..... H03M 7/00 341/61
9,000,958 B1 * 4/2015 Park ..... H03H 17/0628 341/61
10,432,445 B1 * 10/2019 Norris ..... H04L 27/2631
10,826,676 B2 11/2020 Wala
12,003,350 B1 * 6/2024 McCormick ..... H04W 72/044
2002/0164966 A1 * 11/2002 Meehan ..... H04L 25/03146 455/226.1
2008/0309524 A1 12/2008 Syllaios et al.
2009/0261994 A1 10/2009 Petrov
2010/0087227 A1 4/2010 Francos et al.
2010/0091688 A1 4/2010 Staszewski et al.
2010/0158179 A1 * 6/2010 Becker ..... H04L 7/0029 375/355
2016/0087787 A1 * 3/2016 Kim ..... H03H 17/0628 375/355
2016/0277007 A1 * 9/2016 Tangudu ..... H03H 11/04
2018/0316482 A1 * 11/2018 Gudovskiy ..... H04L 7/005
2019/0110084 A1 * 4/2019 Jia ..... H04N 19/126
2020/0212923 A1 * 7/2020 Martin ..... G06F 1/0321

OTHER PUBLICATIONS

European Patent Office, "Partial Supplementary Search Report:" from EP Application No. 19855750.6, May 4, 2022, from Foreign Counterpart to U.S. Appl. No. 16/554,165, pp. 1 through 18, Published: EP.
International Searching Authority, "International Search Report and Written Opinion" from PCT Application No. PCT/US2019/048640, Dec. 13, 2019, From PCT Counterpart of U.S. Application No. 16/554,165; pp. 1-12; Published in WO.
U.S. Patent and Trademark Office, "Notice of Allowance", U.S. Appl. No. 16/554,165, Aug. 28, 2020, pp. 1 through 10, Published: US.
U.S. Patent and Trademark Office, "Office Action", U.S. Appl. No. 16/554,165, May 6, 2020, pp. 1 through 23, Published: US.
Etsi, Open Radio equipment Interface (ORI); Requirement for Open Radio equipment Interface (ORI), ETSI GS ORI 001 v2.1.1, Release 2, May 2013, pp. 1 through 14.
Hsia, Kang, "Modular Communications Transceiver for 4G/5G Distributed Antenna and Base-Stations", Texas Instruments Application Report SLAA860, Aug. 2018, pp. 3 through 19.
Tolstrup, Indoor Radio Planning: A Practical Guide for GSM, DCS, UMTS and HSPA, (Year: 2008), pp. 105 through 155.
Viavi Solutions, "The Evolution of Fronthaul Networks: Pt. 1—An Introduction", Oct. 2, 2017, pp. 1 through 7.

* cited by examiner

EFFICIENT IMPLEMENTATION OF FIXED-RATE FARROW-BASED RESAMPLING FILTER

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

This application *is a reissue of application Ser. No. 16/554,165, filed Aug. 28, 2019, which issued as U.S. Pat. No. 10,826,676, and which* claims the benefit of U.S. Provisional Application Ser. No. 62/725,792, filed Aug. 31, 2018, and titled "EFFICIENT IMPLEMENTATION OF FIXED-RATE FARROW-BASED RESAMPLING FILTER," which is hereby incorporated herein by reference.

BACKGROUND

Digital signal processing systems often require the conversion of a sampled signal to a signal with a different sampling rate. This can be, for example, for purposes of selecting or combining signal components, or as a means of creating an interface between two DSP systems with different clocks. If the ratio between sample rates is an integer, the rate conversion can be implemented with well-known digital up-conversion or down-conversion filters. If the ratio is a simple fraction, say 3-to-2, the conversion can also be implemented by cascading up-conversion and down-conversion stages, or with a polyphase architecture, in which an N/M resampling ratio is achieved by decomposing the filter coefficients into N interleaved sets of components, operating the N resulting FIR filters in parallel, and then selecting every Mth output.

Often, however, the sample rates are not compatible and the resampling ratio cannot be expressed as a ratio of low-order integers. For example, a conversion from 61.44 Msps to 25 Msps involves a ratio of 1536 to 625, which would require an impractically high up-conversion rate or an impractically large number of polyphase stages.

SUMMARY

In an aspect, a method of resampling includes receiving a first sampled signal that is sampled at a first sample rate, where the first sample rate is a submultiple of a system clock rate for a Farrow filter. The method further includes resampling the first sampled signal, using the Farrow filter having a plurality of finite impulse response (FIR) filters and an arbitrary position interpolator, at a second sample rate to generate a second sampled signal. The interpolation factor for each sample of the second sampled signal is retrieved from at least one lookup table stored in memory and the first sample rate and the second sample rate are fixed and locked to a common frequency reference. The method further includes outputting the second sampled signal at the second sample rate.

DRAWINGS

Understanding that the drawings depict only exemplary embodiments and are not therefore to be considered limiting in scope, the exemplary embodiments will be described with additional specificity and detail through the use of the accompanying drawings, in which.

Figure 1:
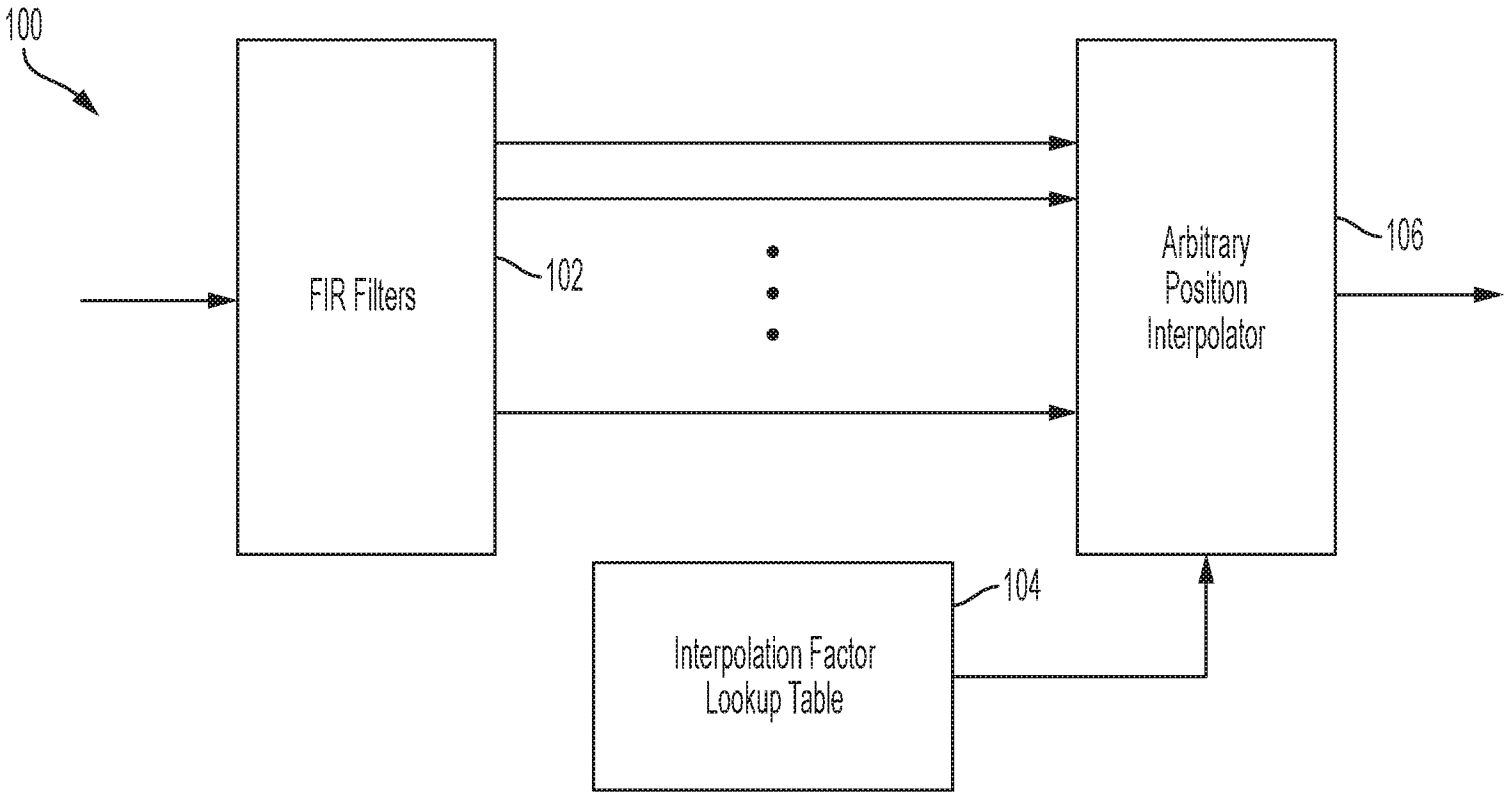
FIG. 1 is a block diagram of an example Farrow-based resampling filter according to an aspect of the present disclosure.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

Farrow filters (also referred to as "Farrow-based resampling filters") calculate the output sample at any arbitrary point in time between input samples by estimating the coefficients of a virtual polyphase filter at the desired sample time (where the value rho(ρ) (also referred to as an "interpolation factor") designates the fractional portion of the output sample position relative to the input samples) and then passing the input samples through the virtual filter. By reordering the multiply and accumulate functions, the Farrow filter simplifies to the processing of input samples with a reasonable number of FIR filters followed by the weighted sum of the filter outputs, where the weights are powers of the interpolation factor.

The Farrow filter is quite effective and theoretically works for any arbitrary resampling ratio. However, it requires that the value of rho be determined for each new output sample. One method of determining rho is to perform a calculation based on a comparative observation of the input and output sample clocks. This method has the advantage of applying to cases in which the exact ratio of sample rates is not known ahead of time (for example, a case in which there is relative drift between the sample clocks due to lack of a common reference), but it is limited by the ability of a discrete time system to accurately determine continuously varying sample times. A second method of determining rho, applicable to cases in which the ratio of sample clocks is fixed, is to perform a calculation based on knowledge of the previous rho value and the known (fixed) clock ratio. This method requires the use of extra care to avoid accumulated roundoff errors. Both of these methods require that rho be recalculated for each and every output sample, a requirement which can consume a significant amount of computational resources. Many widely available Farrow filter reference designs avoid these complexities by imposing simplifying assumptions, such as a requirement that the system clock rate, which is the rate at which the Farrow filter DSP runs, be a multiple of both sample clock rates, a requirement which is often impractical.

For the reasons stated above and for other reasons stated below which will become apparent to those skilled in the art upon reading and understanding the specification, there is a need in the art for improvements for the conversion between sampling rates.

Embodiments of the present application include an efficient Farrow-based resampling filter that can operate in real-time using less computational resources and better accuracy by using a lookup table to provide the rho values for resampling. Rather than calculating the rho value for each output sample, embodiments of the present application retrieve the rho values from a lookup table stored in memory, where the rho values have been predetermined prior to operation.

To implement this solution, a few assumptions are taken into account. First, the input and output sample rates should be fixed and known in advance, and the input and output sample rates should be able to be expressed as an integer ratio. Further, the input and output sample rate clocks should be locked to a common frequency reference such that the difference in clock rate is not varying over time. Lastly, the input sample rate should be a submultiple of the system clock rate, which is the rate at which the Farrow-based resampling filter runs. In some examples, the output sample rate is also a submultiple of the system clock rate; however, in other examples the output sample rate is not a submultiple of the system clock rate.

When these assumptions are satisfied, there is a pattern of output sample positions, and thus rho values, which will repeat at some point in time. The rho values can be calculated in advance and saved in a lookup table to be accessed by the system that is converting between sample rates. In this way, the Farrow-based resampling filter of the present application can operate in real-time using less computational resources and better accuracy by using the lookup table to insert the rho values. The Farrow-based resampling filter can be used to resample between any incompatible sample rates as long as the above assumptions are satisfied.

FIG. 1 is a block diagram of an example Farrow-based resampling filter 100 according to an aspect of the present disclosure. The Farrow-based resampling filter 100 includes a plurality of finite impulse response (FIR) filters 102, an interpolation factor lookup table 104, and an arbitrary position interpolator 106.

The plurality of FIR filters 102 are configured to receive digital input samples, which are sampled at a first sample rate. As discussed above, the first sample rate will be a submultiple of the system clock rate for the Farrow-based resampling filter 100. Each FIR filter 102 of the plurality of FIR filters 102 consists of a chain of delay stages and at least one multiplier circuit. The digital samples contained in the delay stages are multiplied by respective coefficients and summed together. The plurality of FIR filters 102 are arranged in parallel. In a Farrow filter, the output of each of the FIR filters 102 represents a polynomial coefficient. In some examples, each of the FIR filters 102 has a length of five. In some examples, each of the FIR filters 102 is non-symmetrical.

Generally, a Farrow-based resampling filter requires recalculation of interpolation factors for each sample. This recalculation, especially when considering multiple channels, can exceed resources for certain applications or require significant processing resources to be included in the system. The Farrow-based resampling filter 100 shown in FIG. 1 includes an interpolation factor lookup table 104, which contains predetermined values of the interpolation factor for each sample position. The interpolation factor lookup table 104 specifies the difference (in clock cycles) between the calculated time at which the output sample should appear, and the time corresponding to the integer clock cycle on which the output sample is generated. In some examples, the value is offset by 0.5, so that the range is $-0.5<\text{rho}\leq+0.5$, where +0.5 is the starting point (aligned samples), 0 implies an output sample exactly halfway between clocks, and −0.499 would be an output sample time nearly a full clock behind. As discussed above, when the assumptions are satisfied regarding the sample rate relationships, the interpolation factors can be calculated in advance for each sample position and corresponding clock cycle.

Since the system clock rate for the Farrow-based resampling filter 100 will exceed the input sample rate, an input sample is only needed every x system clock cycles, which is determined based on the ratio between the input sample rate and the system clock rate. The interpolation factor lookup table 104 for a single channel implementation will have and entry for every system clock cycle, indicating whether a new output sample is needed at the particular system clock cycle, and the interpolation factor for that particular sample. For multi-channel implementations, the Farrow-based resampling filter 100 operates in a TDM scheme, so there will be a pattern of 'channel' and 'valid' signals that will be regular with respect to the system clock on the input side, but irregular on the output side. The output 'channel' and 'valid' signal patterns repeat at the same rate as the pattern of rho values and can be pre-calculated and stored in the same lookup table 104 or additional lookup tables.

In some examples, the lookup table 104 includes additional columns that indicate the particular channel being sampled. In some examples, the interpolation factor lookup table 104 further includes a variable indicating whether the interpolation factor should be changed for a given system clock cycle. The repetition rate of the interpolation factor is determined ahead of time and can be used for designing the lookup table 104. In some examples, the length of the lookup table can be adjusted depending on the number of system clock cycles required to produce the desired number of output samples.

The arbitrary position interpolator 106 includes a plurality of multipliers and a plurality of summers. The plurality of multipliers are configured to multiply the output of a respective FIR filter with an interpolation factor for a particular sample position to produce a weighted filter output. The arbitrary position interpolator 106 retrieves the interpolation factor from the interpolation factor lookup table 104 for each respective sample position for the output signal. The arbitrary position interpolator 106 sums the weighted filter outputs and generates the resampled output signal.

As discussed above, the Farrow-based resampling filter 100 operates at the system clock rate, which is a multiple of the input sample rate. In some examples, the output sample rate is not a submultiple of this system clock rate, so the pattern of the outputs is irregular with respect to the system clock rate. In such examples, the outputs from the arbitrary position interpolator 106 are placed in a First In First Out (FIFO) memory. The destination digital signal processing system, which will be operating at a clock rate that is a multiple of the output sample rate, then retrieves the samples from the FIFO. In examples where the output sample rate is a submultiple of the system clock rate for the Farrow-based resampling filter 100, the FIFO is unnecessary and excluded.

A particular example of parameters is described herein to explain the operation of the Farrow-based resampling filter 100. It should be understood that the parameters for the Farrow-based resampling filter 100 can be adjusted and operated to accommodate any input/output resampling where the above described assumptions are satisfied.

In a particular example of the Farrow-based resampling filter 100, the input sample rate is 61.44 Msps and the input signal includes 12 channels. The output sample rate is 25.00 Msps, and the system clock rate for the Farrow-based resampling filter is selected to operate at 368.64 MHz, which is six times the input sample rate. For this particular example, the input/output ratio is 1536/625, so there are 625 output samples for every 1536 input samples or 625 output samples for every 9,216 system clock cycles.

In this example, the interpolation factor lookup table includes outputs and counter values for a sequence of 9,216 system clock cycles. The pattern repeats after 9,216 system clock cycles, which is why a lookup table implementation is possible. The lookup table output columns include the sequences governing the generation of output samples, which is irregular in the 368.64 MHz clock domain. In particular, some of the sequences will be 14 system clocks in length and some will be 15 system clocks in length due to the irregularity.

A more efficient design of the interpolation factor lookup table 104 includes multiple lookup tables and uses counters in series rather than increasing the size of a single lookup table. In this particular example of the Farrow-based resampling filter 100, the first lookup table includes the columns related to channel information and can include a variable indicating whether the interpolation factor should be changed for a given system clock cycle. The second lookup table includes the interpolation factor values since these change less frequently.

The first lookup table is of length 9,216 to account for all of the system clock cycles. However, since the interpolation factor only changes whenever a new set of output samples is determined, the second lookup table with the interpolation factor values is of length 625 in this particular example. The interpolation factor remains the same as the output sample is calculated for all 12 channels for each sample time. The second lookup table can be incremented based on the requisite amount of system clock cycles passing for the channel sequence to complete.

The ratio of input/output samples (reduced to lowest terms) specifies the guaranteed repetition rate, and thus the maximum lookup table size necessary. If the input/output ratio (in lowest terms) is input sample rate/output sample rate, and the system clock rate is n times the input sample rate, then n times the input sample rate is the maximum lookup table size. In some examples, there may be a pattern of output sequences that recurs more frequently, allowing for a lookup table size less than n times the input sample rate.

Figure 2A:
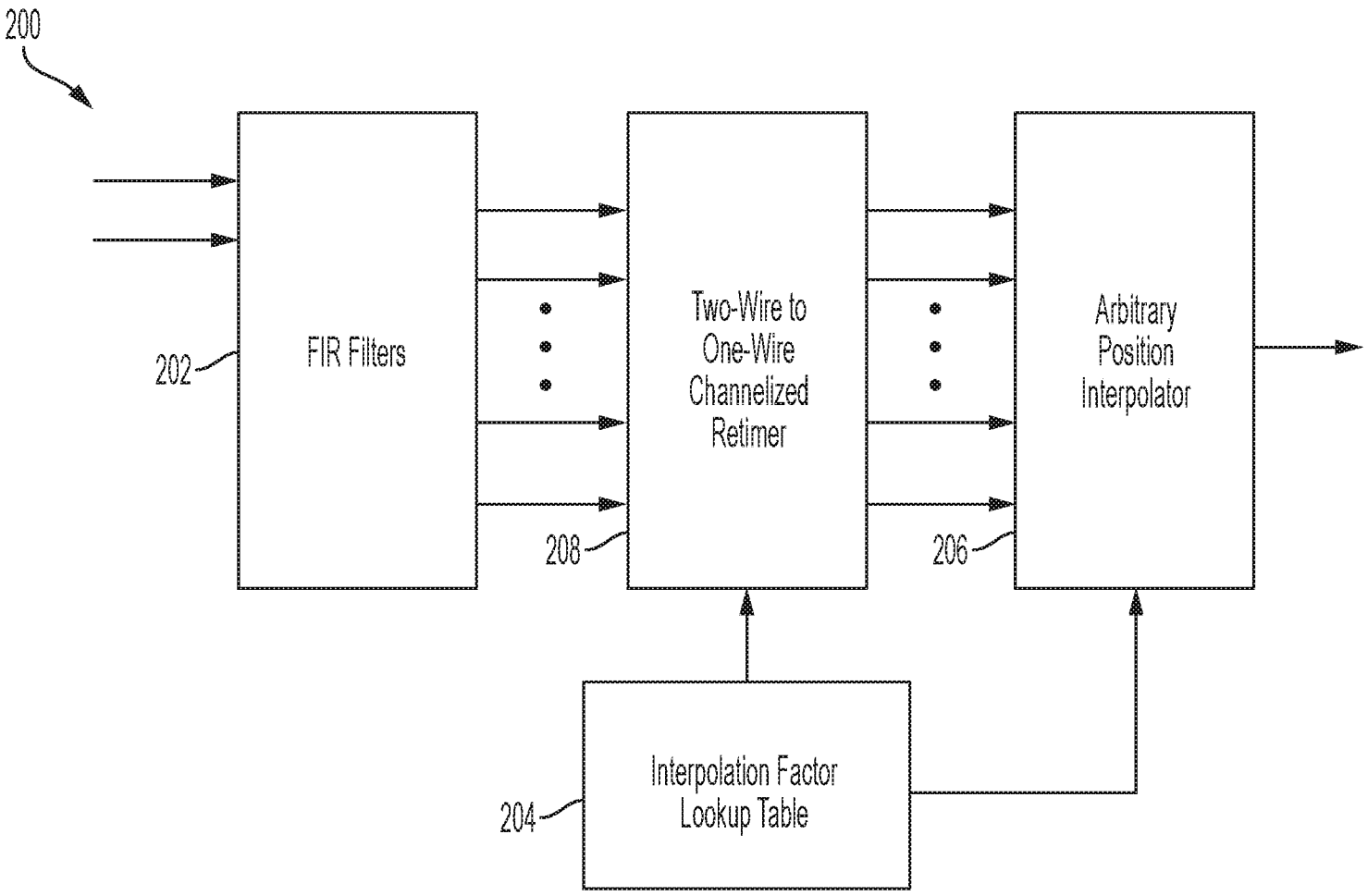
FIG. 2A is a block diagram of an example Farrow-based resampling filter according to an aspect of the present disclosure.
Figure 2B:
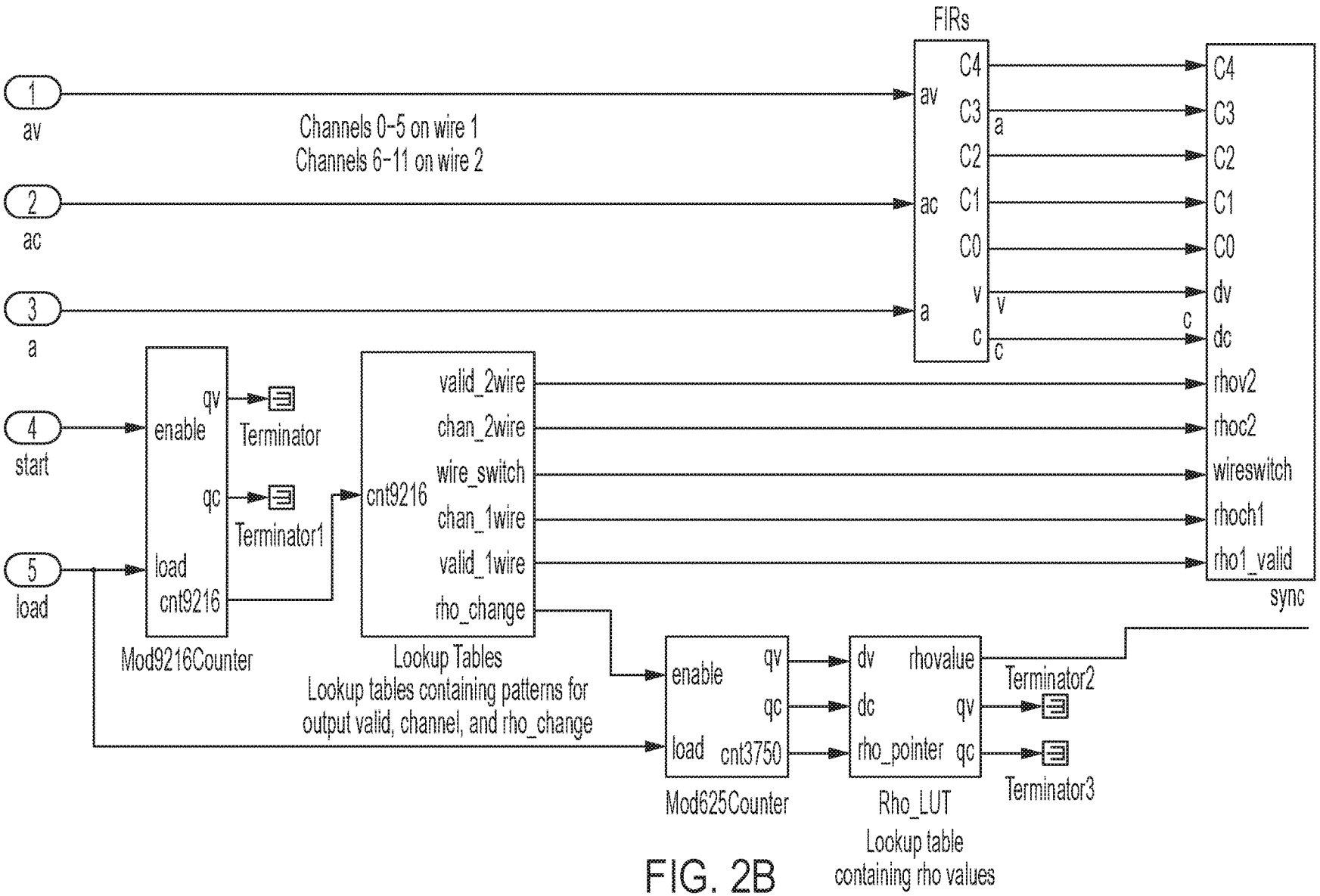
FIG. 2B is a block diagram of a portion of an example Farrow-based resampling filter according to an aspect of the present disclosure.

Depending on the number of channels and the chosen system clock rate for the Farrow-based resampling filter, the topology for providing the sampled input signal may be different than the topology for outputting the resampled output signal from the Farrow-based resampling filter. For example, the sampled input signal may be provided using two or more wires, but the resampled output signal may be output using a single wire. FIGS. 2A-2B are block diagrams of an example Farrow-based resampling filter 200 with different input and output topologies according to an aspect of the present disclosure. The functions, structures, and other description of the Farrow-based resampling filters described herein may apply to Farrow-based resampling filter 200 and vice versa.

The example Farrow-based resampling filter 200 in FIGS. 2A-2B includes similar features to those included in example Farrow-based resampling filter 100 discussed above with respect to FIG. 1. Like named elements are numbered similarly and operate similarly, and only the differences will be discussed with respect to FIGS. 2A-2B. The Farrow-based resampling filter 200 further includes a channelized retimer 208 to accommodate the different input and output topologies. In particular, the example Farrow-based resampling filter 200 in FIG. 2A is configured to receive input signals from two wires and generate an output signal on a single wire. It should be understood that this particular topology is used for explanation purposes and variations with other topologies (for example, three-wire to two-wire) could also be used.

The Farrow-based resampling filter 200 includes a two-wire to one-wire channelized retimer 208 between the plurality of FIR filters 202 and the arbitrary position interpolator 206. When the input and output topologies are different as shown in FIGS. 2A-2B, then additional variables are included in the lookup tables in order to implement the design. The lookup table further includes variables that are provided to the channelized retimer 208 to obtain the data from the two wires in a particular manner.

In the example shown in FIG. 2B, the first variable (valid_2wire) indicates valid 2-wire channel sequences (sequence of 1's that is six system clock cycles long). For the particular parameters discussed above with respect to FIG. 1, valid 2-wire channel sequences will be spaced either 14 or 15 system clock cycles apart due to the irregular output sampling.

In the example shown in FIG. 2B, the second variable (chan_2wire) indicates 2-wire channel sequences (0-5 sequences) and instructs the retimer 208 (sync block) to obtain 12 channels of data (6 channels each from the 2 wires) from the output of the FIR filters. These channel sequences begin on the first integer system clock cycle after the calculated output sample time, which is typically a calculated time that falls between system clock cycles. For the particular parameters discussed above with respect to FIG. 1, these sequences will be spaced either 14 or 15 clock cycles apart due to the irregular output sampling.

In the example shown in FIG. 2B, the third variable (wire_switch) assists the retimer 208 in converting from two-wire to one-wire. It is a sequence of six zeros (instructing the retimer 208 to consecutively grab channels 0-5 from wire 1) followed by six ones (instructing the retimer 208 to consecutively grab channels 6-11 from wire 2).

When the input and output topologies are different as shown in FIGS. 2A-2B, the lookup table further includes two variables that are provided to the channelized retimer 208 to provide data to the single wire in an organized manner.

In the example shown in FIG. 2B, the fourth variable (chan_1wire) defines the 1-wire channel sequences (0-11 sequences) that govern the passing of FIR outputs from the retimer 208 to the arbitrary position interpolator 206. These 1-wire sequences begin at the same time as the 2-wire sequences, and are spaced either 14 or 15 system clock cycles apart, but are 12 system clock cycles in length.

In the example shown in FIG. 2B, the fifth variable (valid_1wire) indicates valid 1-wire channel sequences (sequence of 1's that is twelve system clock cycles long). For the particular parameters discussed above with respect to FIG. 1, valid 1-wire channel sequences will be spaced either 14 or 15 system clock cycles apart due to the irregular output sampling.

As discussed above, further efficiencies can be realized by using more than one lookup table. In the example shown in FIG. 2B, the lookup table with the rho values is distinct from the lookup table containing the other variables. The variable (rho_change) indicates the first system clock cycle corresponding to a new output sample and increments a counter, which points to the next rho value in the lookup table.

Figure 3:
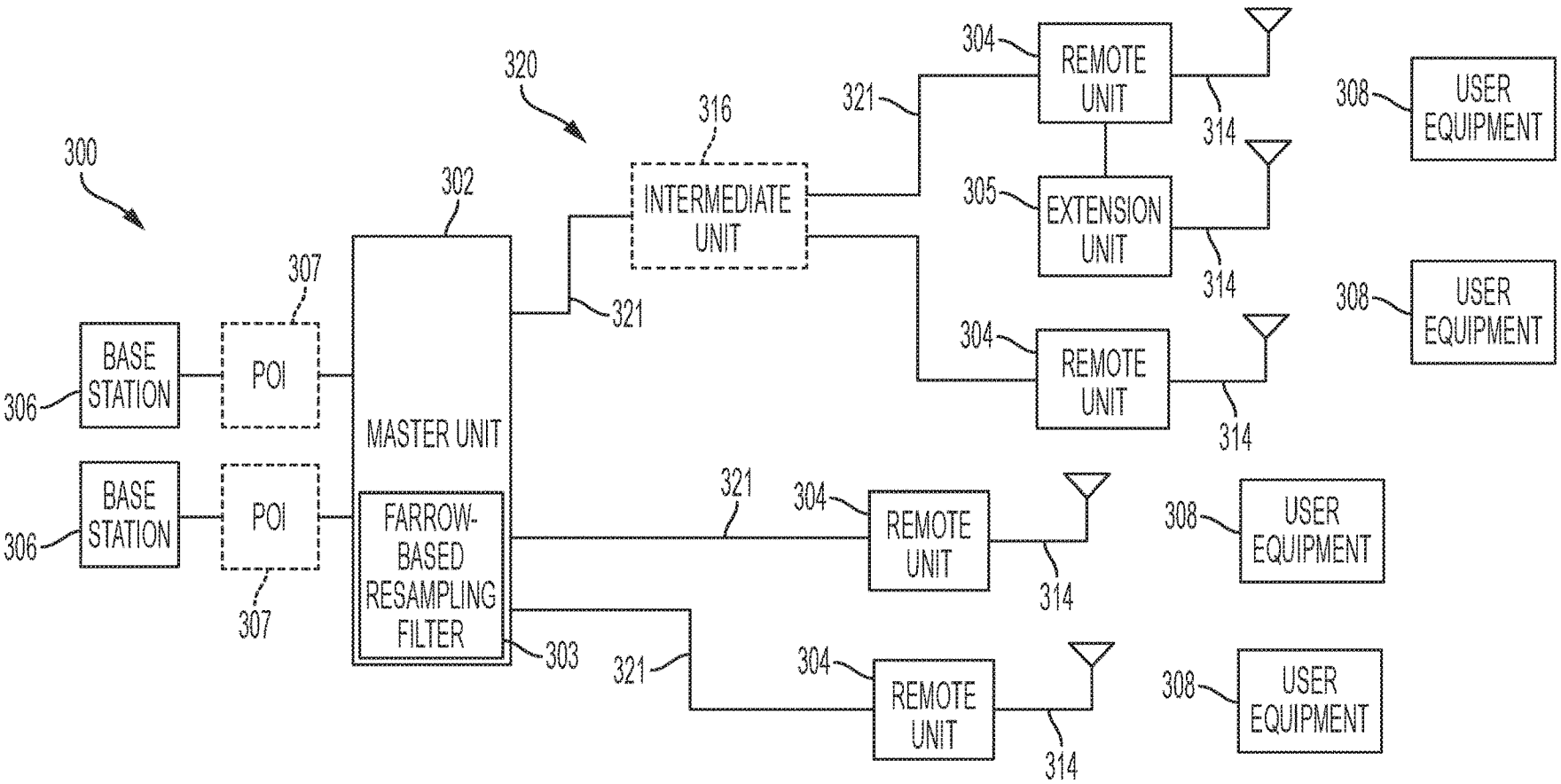
FIG. 3 is a block diagram of an example distributed antenna system that includes a Farrow-based resampling filter according to an aspect of the present disclosure.

The Farrow-based resampling filters 100, 200 described above can operate in real-time using less computational resources. One particular application of this concept is for a telecommunication system using digital fronthaul communication links. FIG. 3 is a block diagram of an example distributed antenna system (DAS) 300 including a Farrow-based resampling filter 303 according to an aspect of the present disclosure. The functions, structures, and other description of the similarly named features for such examples described herein with respect to FIG. 3 may apply to Farrow-based resampling filters described above with respect to FIGS. 1-2 and vice versa.

The DAS 300 comprises one or more master units 302 (also referred to as "host units" or "central area nodes") and one or more remote antenna units 304 (also referred to as "remote units") that are communicatively coupled to the one or more master units 302. In this example, the DAS 300 comprises a digital DAS, in which DAS traffic is distributed between the master units 302 and the remote antenna units 304 in digital form.

The master unit 302 is communicatively coupled to one or more base stations 306. One or more of the base stations 306 can be co-located with the respective master unit 302 to which it is coupled (for example, where the base station 306 is dedicated to providing base station capacity to the DAS). Also, one or more of the base stations 306 can be located remotely from the respective master unit 302 to which it is coupled (for example, where the base station 306 is a macro base station providing base station capacity to a macro cell in addition to providing capacity to the DAS). In this latter case, a master unit 302 can be coupled to a donor antenna in order to wirelessly communicate with the remotely located base station 306.

The base stations 306 can be implemented as a traditional monolithic base station. Also, the base stations 306 can be implemented using a distributed base station architecture in which a base band unit (BBU) is coupled to one or more remote radio heads (RRHs), where the front haul between the BBU and the RRH uses streams of digital IQ samples. Examples of such an approach are described in the Common Public Radio Interface (CPRI) and Open Base Station Architecture Initiative (OBSAI) families of specifications.

The master unit 302 can be configured to use wideband interfaces or narrowband interfaces to the base stations 306. Also, the master unit 302 can be configured to interface with the base stations 306 using analog radio frequency (RF) interfaces or digital interfaces (for example, using a CPRI or OBSAI digital IQ interface). In some examples, the master unit 302 interfaces with the base stations 306 via one or more wireless interface nodes (not shown). A wireless interface node can be located, for example, at a base station hotel, and group a particular part of a RF installation to transfer to the master unit 302.

Traditionally, a master unit 302 interfaces with one or more base stations 306 using the analog radio frequency signals that each base station 306 communicates to and from user equipment 308 (also referred to as "mobile units" or "mobile devices") using a suitable air interface standard. The DAS operates as a distributed repeater for such radio frequency signals. RF signals transmitted from each base station 306 (also referred to herein as "downlink RF signals") are received at the master unit 302. In such examples, the master unit 302 uses the downlink RF signals to generate a downlink transport signal that is distributed to one or more of the remote antenna units 304. Each such remote antenna unit 304 receives the downlink transport signal and reconstructs a version of the downlink RF signals based on the downlink transport signal and causes the reconstructed downlink RF signals to be radiated from at least one antenna 314 coupled to or included in that remote antenna unit 304.

A similar process can be performed in the uplink direction. RF signals transmitted from mobile units (also referred to herein as "uplink RF signals") are received at one or more remote antenna units 304. Each remote antenna unit 304 uses the uplink RF signals to generate an uplink transport signal that is transmitted from the remote antenna unit 304 to a master unit 302. The master unit 302 receives uplink transport signals transmitted from one or more remote antenna units 304 coupled to it. The master unit 302 combines data or signals communicated via the uplink transport signals received at the master unit 302 and can reconstruct a version of the uplink RF signals received at the remote antenna units 304. In such examples, the master unit 302 communicates the reconstructed uplink RF signals to one or more base stations 306. In this way, the coverage of the base stations 306 can be expanded using the DAS.

As noted above, in the example shown in FIG. 3, the DAS is implemented as a digital DAS. In a "digital" DAS, signals received from and provided to the base stations 306 and mobile units 308 are used to produce digital in-phase (I) and quadrature (Q) samples, which are communicated between the master unit 302 and remote antenna units 304. It is important to note that this digital IQ representation of the original signals received from the base stations 306 and from the mobile units 308 still maintains the original modulation (that is, the change in the amplitude, phase, or frequency of a carrier) used to convey telephony or data information pursuant to the cellular air interface protocol used for wirelessly communicating between the base stations 306 and the mobile units 308. Examples of such cellular air interface protocols include, for example, the Global System for Mobile Communication (GSM), Universal Mobile Telecommunications System (UMTS), High-Speed Downlink Packet Access (HSDPA), and Long-Term Evolution (LTE) air interface protocols. Also, each stream of digital IQ samples represents or includes a portion of wireless spectrum. For example, the digital IQ samples can represent a single radio access network carrier (for example, a UMTS or LTE carrier of 5 MHz) onto which voice or data information has been modulated using a UMTS or LTE air interface. However, it is to be understood that each such stream can also represent multiple carriers (for example, in a band of frequency spectrum or a sub-band of a given band of frequency spectrum).

In the example shown in FIG. 3, the master unit 302 can be configured to interface with one or more base stations 306 using an analog RF interface (for example, either a traditional monolithic base station or via the analog RF interface of an RRH). The base stations 306 can be coupled to the master unit 302 using a network of attenuators, combiners, splitters, amplifiers, filters, cross-connects, etc., which is referred to collectively as a point-of-interface (POI) 307. This is done so that, in the downstream, the desired set of RF carriers output by the base stations 306 can be extracted, combined, and routed to the appropriate master unit 302, and so that, in the upstream, the desired set of carriers output by the master unit 302 can be extracted, combined, and routed to the appropriate interface of each base station 306.

In the example shown in FIG. 3, in the downstream, the master unit 302 can produce digital IQ samples from an analog wireless signal received at radio frequency (RF) by down-converting the received signal to an intermediate frequency (IF) or to baseband, digitizing the down-converted signal to produce real digital samples, and digitally down-converting the real digital samples to produce digital in-phase (I) and quadrature (Q) samples. These digital IQ samples can also be filtered, amplified, attenuated, and/or re-sampled or decimated to a lower sample rate. The digital samples can be produced in other ways. Each stream of digital IQ samples represents a portion of wireless radio frequency spectrum output by one or more base stations 306. Each portion of wireless radio frequency spectrum can include, for example, a band of wireless spectrum, a sub-band of a given band of wireless spectrum, or an individual wireless carrier.

Likewise, in the upstream, the master unit 302 can produce an upstream analog wireless signal from one or more streams of digital IQ samples received from one or more remote antenna units 304 by digitally combining streams of digital IQ samples that represent the same carriers or frequency bands or sub-bands (for example, by digitally summing such digital IQ samples), digitally up-converting the combined digital IQ samples to produce real digital samples, performing a digital-to-analog process on the real samples in order to produce an IF or baseband analog signal, and up-converting the IF or baseband analog signal to the desired RF frequency. The digital IQ samples can also be filtered, amplified, attenuated, and/or re-sampled or interpolated to a higher sample rate, before and/or after being combined. The analog signal can be produced in other ways (for example, where the digital IQ samples are provided to a quadrature digital-to-analog converter that directly produces the analog IF or baseband signal).

In the example shown in FIG. 3, the master unit 302 can be configured to interface with one or more base stations 306 using a digital interface (in addition to, or instead of) interfacing with one or more base stations 306 via an analog RF interface. For example, the master unit 302 can be configured to interact directly with one or more BBUs using the digital IQ interface that is used for communicating between the BBUs and an RRHs (for example, using the CPRI serial digital IQ interface).

In the downstream, the master unit 302 terminates one or more downstream streams of digital IQ samples provided to it from one or more BBUs and, if necessary, converts (by re-sampling, synchronizing, combining, separating, gain adjusting, etc.) them into downstream streams of digital IQ samples compatible with the remote antenna units 304 used in the DAS. In the upstream, the master unit 302 receives upstream streams of digital IQ samples from one or more remote antenna units 304, digitally combining streams of digital IQ samples that represent the same carriers or frequency bands or sub-bands (for example, by digitally summing such digital IQ samples), and, if necessary, converts (by re-sampling, synchronizing, combining, separating, gain adjusting, etc.) them into upstream streams of digital IQ samples compatible with the one or more BBUs that are coupled to that master unit 302.

In some examples, the master unit 302 utilizes the Farrow-based resampling filter 303 in the downstream for the re-sampling of the digital IQ samples provided to it from one or more BBUs. The Farrow-based resampling filter 303 operates in a similar manner to the Farrow-based resampling filters 100, 200 discussed above with respect to FIGS. 1-2B. In some examples, the master unit 302 of the DAS 300 includes a CPRI serial digital IQ interface and resamples the input signals from the CPRI sample rate to a sample rate compatible with the components of the DAS 300.

In some examples, the master unit 302 utilizes a Farrow-based resampling filter 303 in the upstream for the re-sampling of the digital IQ samples that it provides to one or more BBUs. In some examples, the master unit 302 of the DAS 300 resamples the digital IQ samples received from the remote antenna units 304 from the sample rate compatible with the components of the DAS 300 to the CPRI sample rate. In some examples, distinct Farrow-based resampling filters are used for the upstream and the downstream re-sampling.

In the downstream, each remote antenna unit 304 receives streams of digital IQ samples from the master unit 302, where each stream of digital IQ samples represents a portion of wireless radio frequency spectrum output by one or more base stations 306.

In some aspects, the master unit 302 are directly coupled to the remote antenna units 304. In such aspects, the master unit 302 are coupled to the remote antenna units 304 using a communication medium 321. For example, the communication medium 321 can include optical fiber or Ethernet cable complying with the Category 5, Category 5e, Category 6, Category 6A, or Category 7 specifications. Future communication medium specifications used for Ethernet signals are also within the scope of the present disclosure.

In some aspects, one or more intermediate units 316 (also referred to as "expansion units" or "transport expansion nodes") can be placed between the master unit 302 and one or more of the remote antenna units 304. This can be done, for example, in order to increase the number of remote antenna units 304 that a single master unit 302 can feed, to increase the master-unit-to-remote-antenna-unit distance, and/or to reduce the amount of cabling needed to couple a master unit 302 to its associated remote antenna units 304. The expansion units 316 are coupled to the master unit 302 via one or more communication links 321. In some examples, the communication links include optical communication links or other wired communication medium.

In the example DAS 300 shown in FIG. 3, a remote antenna unit 304 is shown having another remote antenna unit 305 (also referred to herein as an "extension unit") communicatively coupled to it in a daisy chain. In operation, the remote antenna units 304, 305 could be used for MIMO transmissions, for example. The remote antenna unit 304 is communicatively coupled to the remote antenna units 305 using a fiber optic cable, a multi-conductor cable, coaxial cable, or the like. In such an implementation, the remote antenna units 305 are coupled to the master unit 302 of the DAS 300 via the remote antenna unit 304.

In various aspects, system elements, method steps, or examples described throughout this disclosure (such as the Farrow-based resampling filters, master unit, expansion units, remote antenna units, user equipment, or components thereof, for example) may be implemented on one or more computer systems, field programmable gate array (FPGA), application specific integrated circuit (ASIC) or similar devices comprising hardware executing code to realize those elements, processes, or examples, said code stored on a non-transient data storage device. These devices include or function with software programs, firmware, or other computer readable instructions for carrying out various methods, process tasks, calculations, and control functions, used for synchronization and fault management in a distributed antenna system.

These instructions are typically stored on any appropriate computer readable medium used for storage of computer readable instructions or data structures. The computer readable medium can be implemented as any available media that can be accessed by a general purpose or special purpose computer or processor, or any programmable logic device. Suitable processor-readable media may include storage or memory media such as magnetic or optical media. For example, storage or memory media may include conventional hard disks, Compact Disk-Read Only Memory (CD-ROM), volatile or non-volatile media such as Random Access Memory (RAM) (including, but not limited to, Synchronous Dynamic Random Access Memory (SDRAM), Double Data Rate (DDR) RAM, RAMBUS Dynamic RAM (RDRAM), Static RAM (SRAM), etc.), Read Only Memory (ROM), Electrically Erasable Programmable ROM (EEPROM), and flash memory, etc. Suitable processor-readable media may also include transmission media such as electrical, electromagnetic, or digital signals, conveyed via a communication medium such as a network and/or a wireless link.

The methods and techniques described here may be implemented in digital electronic circuitry, or with a programmable processor (for example, a special-purpose processor or a general-purpose processor such as a computer) firmware, software, or in combinations of them. Apparatus embodying these techniques may include appropriate input and output devices, a programmable processor, and a storage medium tangibly embodying program instructions for execution by the programmable processor. A process embodying these techniques may be performed by a programmable processor executing a program of instructions to perform desired functions by operating on input data and generating appropriate output. The techniques may advantageously be implemented in one or more programs that are executable on a programmable system including at least one programmable processor coupled to receive data and instructions from, and to transmit data and instructions to, a data storage system, at least one input device, and at least one output device. Generally, a processor will receive instructions and data from a read-only memory and/or a random access memory. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and DVD disks. Any of the foregoing may be supplemented by, or incorporated in, specially-designed application-specific integrated circuits (ASICs).

Example Embodiments

Example 1 includes a method of resampling, comprising: receiving a first sampled signal, wherein the first sampled signal is sampled at a first sample rate, wherein the first sample rate is a submultiple of a system clock rate for a Farrow filter; resampling the first sampled signal, using the Farrow filter having a plurality of finite impulse response (FIR) filters and an arbitrary position interpolator, at a second sample rate to generate a second sampled signal, wherein an interpolation factor for each sample of the second sampled signal is retrieved from at least one lookup table stored in memory, wherein the first sample rate and the second sample rate are fixed and locked to a common frequency reference; outputting the second sampled signal at the second sample rate.

Example 2 includes the method of Example 1, wherein the second sample rate is a submultiple of the system clock rate.

Example 3 includes the method of any of Examples 1-2, wherein the second sample rate is not a submultiple of the system clock rate, wherein outputting the second sampled signal comprises outputting the second sampled signal to a First In First Out (FIFO) memory.

Example 4 includes the method of any of Examples 1-3, wherein receiving the first sampled signal comprises receiving a plurality of channels, wherein outputting the second sampled signal at the second sample rate comprises outputting a plurality of channels.

Example 5 includes the method of Example 4, wherein receiving the plurality of channels comprises receiving the plurality of channels over one or more first wires, wherein outputting the second sampled signal at the second sample rate comprises outputting the plurality of channels over a single wire.

Example 6 includes the method of Example 5, wherein the plurality of channels are received by the Farrow filter over two first wires, wherein the method further comprises retiming an output of the FIR filters based on sequences stored in the at least one lookup table.

Example 7 includes a Farrow-based resampling filter comprising: a plurality of finite impulse response (FIR) filters arranged in parallel, wherein each of the plurality of FIR filters are configured to receive one or more sampled input signals, wherein the one or more sampled input signals are sampled at a first sample rate that is a submultiple of a system clock rate for the Farrow-based resampling filter; an arbitrary position interpolator communicatively coupled to the plurality of FIR filters and configured to receive outputs of the plurality of FIR filters, wherein the arbitrary position interpolator is configured to generate one or more second sampled signals at a second sample rate based on the outputs of the plurality of FIR filters; and wherein the arbitrary position interpolator is configured to: multiply each respective output from each respective FIR filter of the plurality of FIR filters by an interpolation factor retrieved from at least one lookup table to generate weighted outputs, wherein the at least one lookup table comprises a plurality of predetermined interpolation factors, wherein each of the plurality of predetermined interpolation factors is associated with an output sample position; sum the weighted outputs to generate one or more second sampled signals at a second sample rate; output the one or more second sampled signals at the second sample rate.

Example 8 includes the Farrow-based resampling filter of Example 7, wherein the second sample rate is a submultiple of the system clock rate.

Example 9 includes the Farrow-based resampling filter of any of Examples 7-8, wherein the second sample rate is not a submultiple of the system clock rate, wherein the arbitrary position interpolator is configured to output the second sampled signal to a First In First Out (FIFO) memory.

Example 10 includes the Farrow-based resampling filter of any of Examples 7-9, wherein the plurality of FIR filters are configured to receive a plurality of channels, wherein the arbitrary position interpolator is configured to output a plurality of channels.

Example 11 includes the Farrow-based resampling filter of Example 10, wherein the at least one lookup table further comprises predetermined channel sequences.

Example 12 includes the Farrow-based resampling filter of Example 11, wherein the plurality of FIR filters are configured to receive a plurality of channels over one or more first wires, wherein the arbitrary position interpolator is configured to output a plurality of channels over a single wire.

Example 13 includes the Farrow-based resampling filter of Example 12, wherein the plurality of channels are received by the Farrow-based resampling filter over two input wires, wherein the Farrow-based resampling filter further comprises a channelized retimer configured to retime an output of the FIR filters based on the predetermined channel sequences and predetermined wire sequences stored in the at least one lookup table.

Example 14 includes the Farrow-based resampling filter of any of Examples 7-13, wherein the Farrow-based resampling filter is implemented in a component of a telecommunication system.

Example 15 includes a distributed antenna system, comprising: a master unit communicatively coupled to a base station using a digital interface, wherein the master unit comprises at least one Farrow filter having a plurality of finite impulse response (FIR) filters and an arbitrary position interpolator; and a plurality of remote antenna units communicatively coupled to the master unit and located remotely from the master unit, wherein the plurality of remote antenna units is configured to transmit and receive wireless signals with user equipment; wherein the master unit is configured to: receive a first sampled signal in the downlink from the base station, wherein the first sampled signal is sampled at a first sample rate, wherein the first sample rate is a submultiple of a system clock rate for the at least one Farrow filter; resample the first sampled signal, using the at least one Farrow filter, at a second sample rate to generate a second sampled signal, wherein an interpolation factor for each sample of the second sampled signal is retrieved from at least one lookup table stored in memory, wherein the first sample rate and the second sample rate are fixed and locked to a common frequency reference; output the second sampled signal at the second sample rate to the plurality of remote antenna units.

Example 16 includes the distributed antenna system of Example 15, wherein the base station comprises a baseband unit (BBU), wherein the digital interface is configured to comply with the Common Public Radio Interface (CPRI) standard.

Example 17 includes the distributed antenna system of any of Examples 15-16, wherein the second sample rate is a submultiple of the system clock rate.

Example 18 includes the distributed antenna system of any of Examples 15-17, wherein the second sample rate is not a submultiple of the system clock rate, wherein the arbitrary position interpolator is configured to output the second sampled signal to the plurality of remote antenna units via a First In First Out (FIFO) memory.

Example 19 includes the distributed antenna system of any of Examples 15-18, wherein the plurality of FIR filters are configured to receive a plurality of channels, wherein the arbitrary position interpolator is configured to output a plurality of channels.

Example 20 includes the distributed antenna system of Example 19, wherein the at least one lookup table further comprises predetermined channel sequences.

Example 21 includes the distributed antenna system of Example 20, wherein the master unit is configured to receive a plurality of channels over one or more first wires, wherein the master unit is configured to output a plurality of channels over a single wire.

Example 22 includes the distributed antenna system of Example 21, wherein the plurality of channels are received by the master unit over two input wires, wherein the at least one Farrow-based resampling filter further comprises a channelized retimer configured to retime an output of the FIR filters based on the predetermined channel sequences and predetermined wire sequences stored in the at least one lookup table.

Example 23 includes the distributed antenna system of any of Examples 15-22, wherein the master unit is further configured to: receive a third sampled signal in the uplink from the plurality of remote antenna units, wherein the third sampled signal is sampled at the second sample rate; resample, using the at least one Farrow filter, the third sampled signal at the first sample rate to generate a fourth sampled signal, wherein an interpolation factor for each sample of the fourth sampled signal is retrieved from at least one lookup table stored in memory; and output the fourth sampled signal at the first sample rate to the base station.

Example 24 includes the distributed antenna system of Example 23, wherein the at least one Farrow filter includes a first Farrow filter in the downlink and a second Farrow filter in the uplink.

A number of embodiments of the invention defined by the following claims have been described. Nevertheless, it will be understood that various modifications to the described embodiments may be made without departing from the spirit and scope of the claimed invention. Accordingly, other embodiments are within the scope of the following claims.

What is claimed is:

1. A method of resampling, comprising:

receiving a first sampled signal, wherein the first sampled signal is sampled at a first sample rate, wherein the first sample rate is a submultiple of a system clock rate for a Farrow filter;

resampling the first sampled signal, using the Farrow filter having a plurality of finite impulse response (FIR) filters and an arbitrary position interpolator, at a second sample rate to generate a second sampled signal, wherein an interpolation factor for each sample of the second sampled signal is retrieved from at least one lookup table stored in memory, wherein the first sample rate and the second sample rate are fixed and locked to a common frequency reference; and outputting the second sampled signal at the second sample rate.

2. The method of claim 1, wherein the second sample rate is a submultiple of the system clock rate.

3. The method of claim 1, wherein the second sample rate is not a submultiple of the system clock rate, wherein outputting the second sampled signal comprises outputting the second sampled signal to a First In First Out (FIFO) memory.

4. The method of claim 1, wherein receiving the first sampled signal comprises receiving a plurality of channels, wherein outputting the second sampled signal at the second sample rate comprises outputting a plurality of channels.

5. The method of claim 4, wherein receiving the plurality of channels comprises receiving the plurality of channels over one or more first wires, wherein outputting the second sampled signal at the second sample rate comprises outputting the plurality of channels over a single wire.

6. The method of claim 5, wherein the plurality of channels are received by the Farrow filter over two first wires, wherein the method further comprises retiming an output of the FIR filters based on sequences stored in the at least one lookup table.

7. A Farrow-based resampling filter comprising:

a plurality of finite impulse response (FIR) filters arranged in parallel, wherein each of the plurality of FIR filters are configured to receive one or more sampled input signals, wherein the one or more sampled input signals are sampled at a first sample rate that is a submultiple of a system clock rate for the Farrow-based resampling filter;

an arbitrary position interpolator communicatively coupled to the plurality of FIR filters and configured to receive outputs of the plurality of FIR filters, wherein the arbitrary position interpolator is configured to generate one or more second sampled signals at a second sample rate based on the outputs of the plurality of FIR filters; and wherein the arbitrary position interpolator is configured to:

multiply each respective output from each respective FIR filter of the plurality of FIR filters by an interpolation factor retrieved from at least one lookup table to generate weighted outputs, wherein the at least one lookup table comprises a plurality of predetermined interpolation factors, wherein each of the plurality of predetermined interpolation factors is associated with an output sample position;

sum the weighted outputs to generate one or more second sampled signals at a second sample rate; and output the one or more second sampled signals at the second sample rate.

8. The Farrow-based resampling filter of claim 7, wherein the second sample rate is a submultiple of the system clock rate.

9. The Farrow-based resampling filter of claim 7, wherein the second sample rate is not a submultiple of the system clock rate, wherein the arbitrary position interpolator is configured to output the second sampled signal to a First In First Out (FIFO) memory.

10. The Farrow-based resampling filter of claim 7, wherein the plurality of FIR filters are configured to receive a plurality of channels, wherein the arbitrary position interpolator is configured to output a plurality of channels.

11. The Farrow-based resampling filter of claim 10, wherein the at least one lookup table further comprises predetermined channel sequences.

12. The Farrow-based resampling filter of claim 11, wherein the plurality of FIR filters are configured to receive a plurality of channels over one or more first wires, wherein the arbitrary position interpolator is configured to output a plurality of channels over a single wire.

13. The Farrow-based resampling filter of claim 12, wherein the plurality of channels are received by the Farrow-based resampling filter over two input wires, wherein the Farrow-based resampling filter further comprises a channelized retimer configured to retime an output of the FIR filters based on the predetermined channel sequences and predetermined wire sequences stored in the at least one lookup table.

14. The Farrow-based resampling filter of claim 7, wherein the Farrow-based resampling filter is implemented in a component of a telecommunication system.

15. A distributed antenna system, comprising:

a master unit communicatively coupled to a base station using a digital interface, wherein the master unit comprises at least one Farrow filter having a plurality of finite impulse response (FIR) filters and an arbitrary position interpolator; and a plurality of remote antenna units communicatively coupled to the master unit and located remotely from the master unit, wherein the plurality of remote antenna units is configured to transmit and receive wireless signals with user equipment;

wherein the master unit *comprises circuity that* is configured to:

receive a first sampled signal in a downlink direction from the base station, wherein the first sampled signal is sampled at a first sample rate, wherein the first sample rate is a submultiple of a system clock rate for the at least one Farrow filter;

resample the first sampled signal, using the at least one Farrow filter, at a second sample rate to generate a second sampled signal, wherein an interpolation factor for each sample of the second sampled signal is retrieved from at least one lookup table stored in memory, wherein the first sample rate and the second sample rate are fixed and locked to a common frequency reference; and output the second sampled signal at the second sample rate to the plurality of remote antenna units.

16. The distributed antenna system of claim 15, wherein the base station comprises a baseband unit (BBU), wherein the digital interface is configured to comply with the Common Public Radio Interface (CPRI) standard.

17. The distributed antenna system of claim 15, wherein the second sample rate is a submultiple of the system clock rate.

18. The distributed antenna system of claim 15, wherein the second sample rate is not a submultiple of the system clock rate, wherein the arbitrary position interpolator is configured to output the second sampled signal to the plurality of remote antenna units via a First In First Out (FIFO) memory.

19. The distributed antenna system of claim 15, wherein the plurality of FIR filters are configured to receive a plurality of channels, wherein the arbitrary position interpolator is configured to output a plurality of channels.

20. The distributed antenna system of claim 19, wherein the at least one lookup table further comprises predetermined channel sequences.

21. The distributed antenna system of claim 20, wherein the *circuitry of the* master unit is configured to receive a plurality of channels over one or more first wires, wherein the *circuitry of the* master unit is configured to output a plurality of channels over a single wire.

22. The distributed antenna system of claim 21, wherein the plurality of channels are received by the master unit over two input wires, wherein the at least one Farrow-based resampling filter further comprises a channelized retimer configured to retime an output of the FIR filters based on the predetermined channel sequences and predetermined wire sequences stored in the at least one lookup table.

23. The distributed antenna system of claim 15, wherein the *circuitry of the* master unit is further configured to:

receive a third sampled signal in an uplink direction from the plurality of remote antenna units, wherein the third sampled signal is sampled at the second sample rate;

resample, using the at least one Farrow filter, the third sampled signal at the first sample rate to generate a fourth sampled signal, wherein an interpolation factor for each sample of the fourth sampled signal is retrieved from at least one lookup table stored in memory; and output the fourth sampled signal at the first sample rate to the base station.

24. The distributed antenna system of claim 23, wherein the at least one Farrow filter includes a first Farrow filter in the downlink and a second Farrow filter in the uplink.

*25. The distributed antenna system of claim 15, wherein the base station comprises at least one baseband unit (BBU) comprising circuitry configured to perform at least some baseband processing for an air interface used to wirelessly communicate with user equipment, wherein the circuitry of the master unit is configured to interact directly with the at least one BBU using the digital interface that is configured to be used for communicating between the at least one BBU and an RRH.*

*26. The distributed antenna system of claim 15, wherein the circuitry of the master unit is configured to output the second sampled single for communication over Ethernet cabling.*

*27. A distributed antenna system for use with a base station comprising at least one baseband unit (BBU) comprising circuitry configured to perform at least some baseband processing for an air interface used to wirelessly communicate with user equipment, the distributed antenna system comprising:*

*a master unit communicatively coupled to the at least one BBU using a digital interface, wherein the master unit comprises at least one Farrow filter having a plurality of finite impulse response (FIR) filters and an arbitrary position interpolator; and*

*a plurality of remote antenna units communicatively coupled to the master unit and located remotely from the master unit, wherein the plurality of remote antenna units is configured to transmit and receive wireless signals with user equipment;*

*wherein the master unit comprises circuitry that is configured to:*

*receive first digital IQ data in a downlink direction from the at least one BBU,*

*convert the first digital IQ data to time domain digital IQ data at a first sample rate, wherein the first sample rate is a submultiple of a system clock rate for the at least one Farrow filter;*

*resample the time domain digital IQ data, using the at least one Farrow filter, at a second sample rate to generate second time domain digital IQ data comprising IQ samples, wherein an interpolation factor for each sample of the second time domain digital IQ data is retrieved from at least one lookup table stored in memory, wherein the first sample rate and the second sample rate are fixed and locked to a common frequency reference; and*

*communicate data generated from at least some of the second time domain digital IQ data to one or more of the plurality of remote antenna units.*

*28. The distributed antenna system of claim 27, wherein the circuitry of the master unit is configured to interact directly with the at least one BBU using the digital interface that is configured to be used for communicating between the at least one BBU and an RRH.*

*29. The distributed antenna system of claim 27, wherein the circuitry of the master unit is configured to output the data generated from the at least some of the second time domain digital IQ data for communication over Ethernet cabling.*

*30. The distributed antenna system of claim 27, wherein the data generated from the at least some of the second time domain digital IQ data includes multiple sub-bands.*

* * * * *